(12) United States Patent
Burke et al.

(10) Patent No.: US 7,928,521 B1
(45) Date of Patent: Apr. 19, 2011

(54) NON-TENSIONED CARBON NANOTUBE SWITCH DESIGN AND PROCESS FOR MAKING SAME

(75) Inventors: Peter A. Burke, Portland, OR (US); Thomas Rueckes, Rockport, MA (US); Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 1184 days.

(21) Appl. No.: 11/142,725

(22) Filed: May 31, 2005

(51) Int. Cl.
*H01L 29/82* (2006.01)
(52) U.S. Cl. ........................................ 257/415; 977/932
(58) Field of Classification Search .................. 257/415; 977/932
See application file for complete search history.

(56) References Cited

U.S. PATENT DOCUMENTS

| | | |
|---|---|---|
| 4,979,149 A | 12/1990 | Popovic et al. |
| 6,100,109 A | 8/2000 | Melzner et al. |
| 6,128,214 A | 10/2000 | Kuekes et al. |
| 6,250,984 B1 | 6/2001 | Jin et al. |
| 6,256,767 B1 | 7/2001 | Kuekes et al. |
| 6,314,019 B1 | 11/2001 | Kuekes et al. |
| 6,423,583 B1 | 7/2002 | Avouris et al. |
| 6,426,687 B1 | 7/2002 | Osborn |
| 6,443,901 B1 | 9/2002 | Fraser |
| 6,445,006 B1 | 9/2002 | Brandes et al. |
| 6,548,841 B2 | 4/2003 | Frazier et al. |
| 6,643,165 B2 | 11/2003 | Segal et al. ............ 365/151 |
| 6,706,402 B2 | 3/2004 | Rueckes et al. |
| 6,803,840 B2 | 10/2004 | Hunt et al. |
| 6,809,462 B2 | 10/2004 | Pelrine et al. |
| 6,919,592 B2 | 7/2005 | Segal et al. |
| 6,919,740 B2 | 7/2005 | Snider |
| 6,924,538 B2 | 8/2005 | Jaiprakash et al. |
| 6,955,937 B1 | 10/2005 | Burke et al. |
| 6,969,651 B1 | 11/2005 | Lu et al. |
| 2004/0181630 A1 | 9/2004 | Jaiprakash et al. |

(Continued)

FOREIGN PATENT DOCUMENTS

GB 2364933 A 2/2002

(Continued)

OTHER PUBLICATIONS

Avouris, P., "Carbon Nanotube Electronics," Chemical Physics 281, 2002, pp. 429-445, 17 pages.
Bradley, et al., "Flexible Nanotube Electronics," Nano Letters, 2003, vol. 3, No. 10, pp. 1353-1355, 3 pages.

(Continued)

*Primary Examiner* — Samuel A Gebremariam
(74) *Attorney, Agent, or Firm* — Wilmer Cutler Pickering Hale and Dorr LLP

(57) ABSTRACT

The invention comprises a carbon nanotube switch suitable for use in an integrated circuit structure and capable of being moved from a first position in a first plane in the switch to a second position in a second plane in the switch using approximately the same energy as required to move the switch from the second position back to the first position. The switch comprises a flexible carbon nanotube strip secured clamped at one end in a first plane in a switching chamber, and secured or clamped, at the opposite end of the carbon nanotube, in a second plane in the switching chamber, which is parallel to the first plane but spaced therefrom, to permit the central portion of the carbon nanotube strip to move in the chamber between a first position in the first plane and in electrical contact with one or more first electrodes and a second position in the second plane and in electrical contact with one or more second electrodes.

4 Claims, 8 Drawing Sheets

U.S. PATENT DOCUMENTS

| | | |
|---|---|---|
| 2004/0238907 A1 | 12/2004 | Pinkerton et al. |
| 2005/0065741 A1 | 3/2005 | Segal et al. |
| 2005/0068128 A1 | 3/2005 | Yip |
| 2006/0237799 A1 | 10/2006 | Lu et al. |
| 2006/0278902 A1 | 12/2006 | Sun et al. |

FOREIGN PATENT DOCUMENTS

| | | |
|---|---|---|
| WO | WO-0048195 A1 | 8/2000 |

OTHER PUBLICATIONS

Dequesnes, et al., "Calculation of pull-in voltages for carbon-nanotube-based nanoelectromechanical switches," Nanotechnology 13, 2002, pp. 120-131, 12 pages.

Kaneto, et al., "Electrical Conductivities of Multi-Wall Carbon Nanotubes," Synthetic Metals, 103, 1999, pp. 2543-2546, 4 pages.

Stadermann, et al., "Nanoscale Study of Conduction Through Carbon Nanotube Networks," Physical Review B 69, 201402(R), 2004, 3 pages.

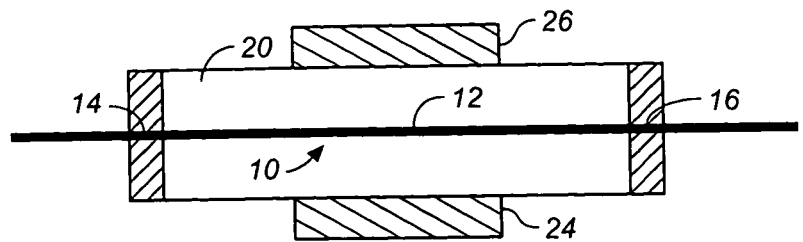
FIG._1
*(PRIOR ART)*
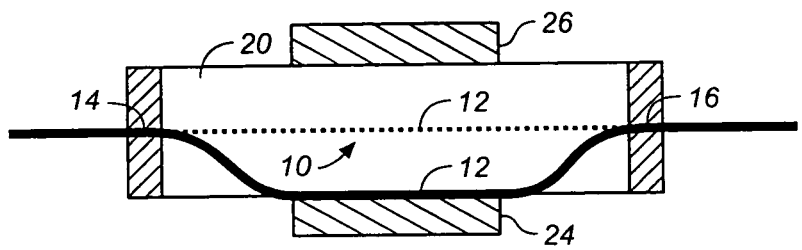
FIG._2
*(PRIOR ART)*
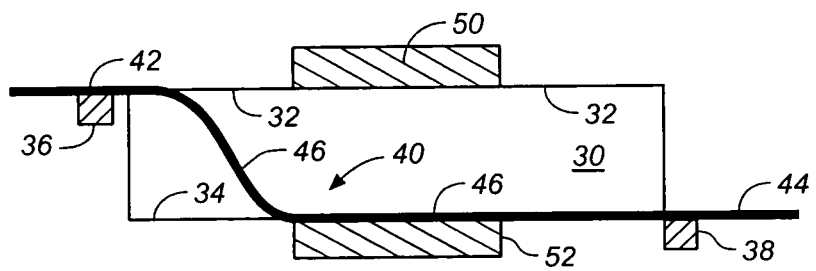
FIG._3a
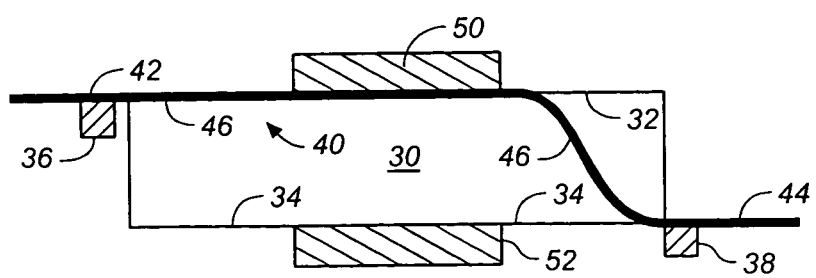
FIG._3b

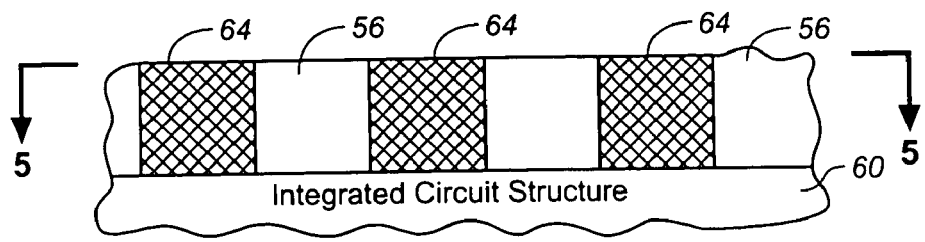
FIG._4
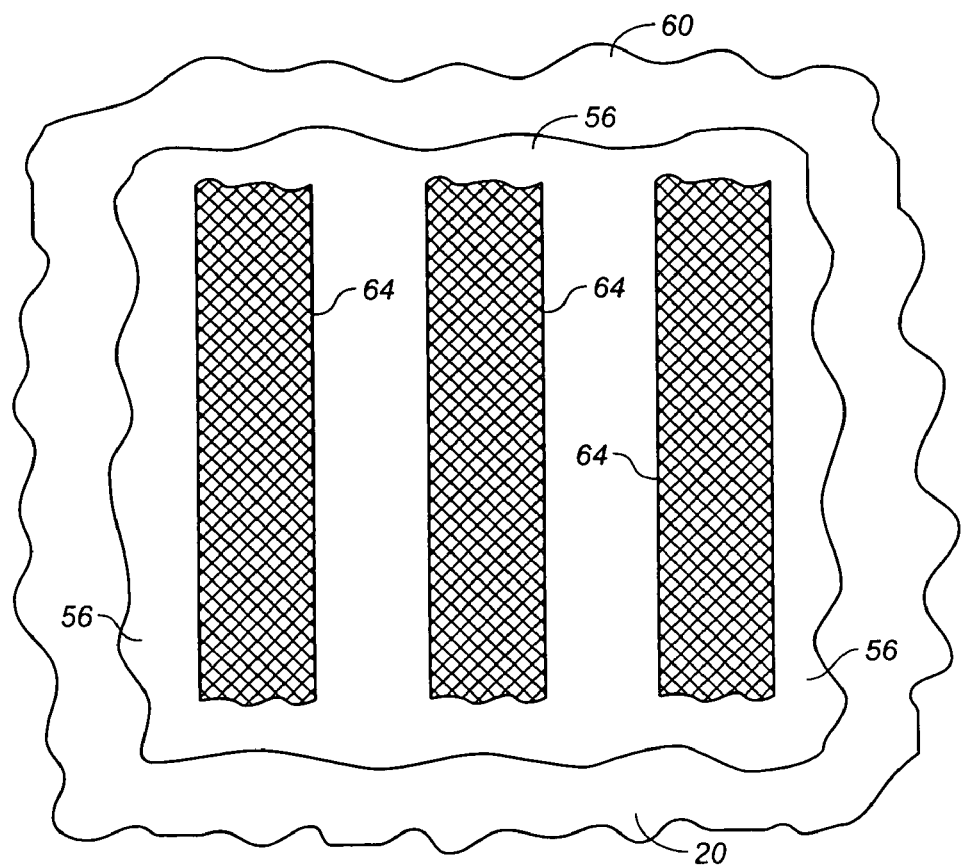
FIG._5

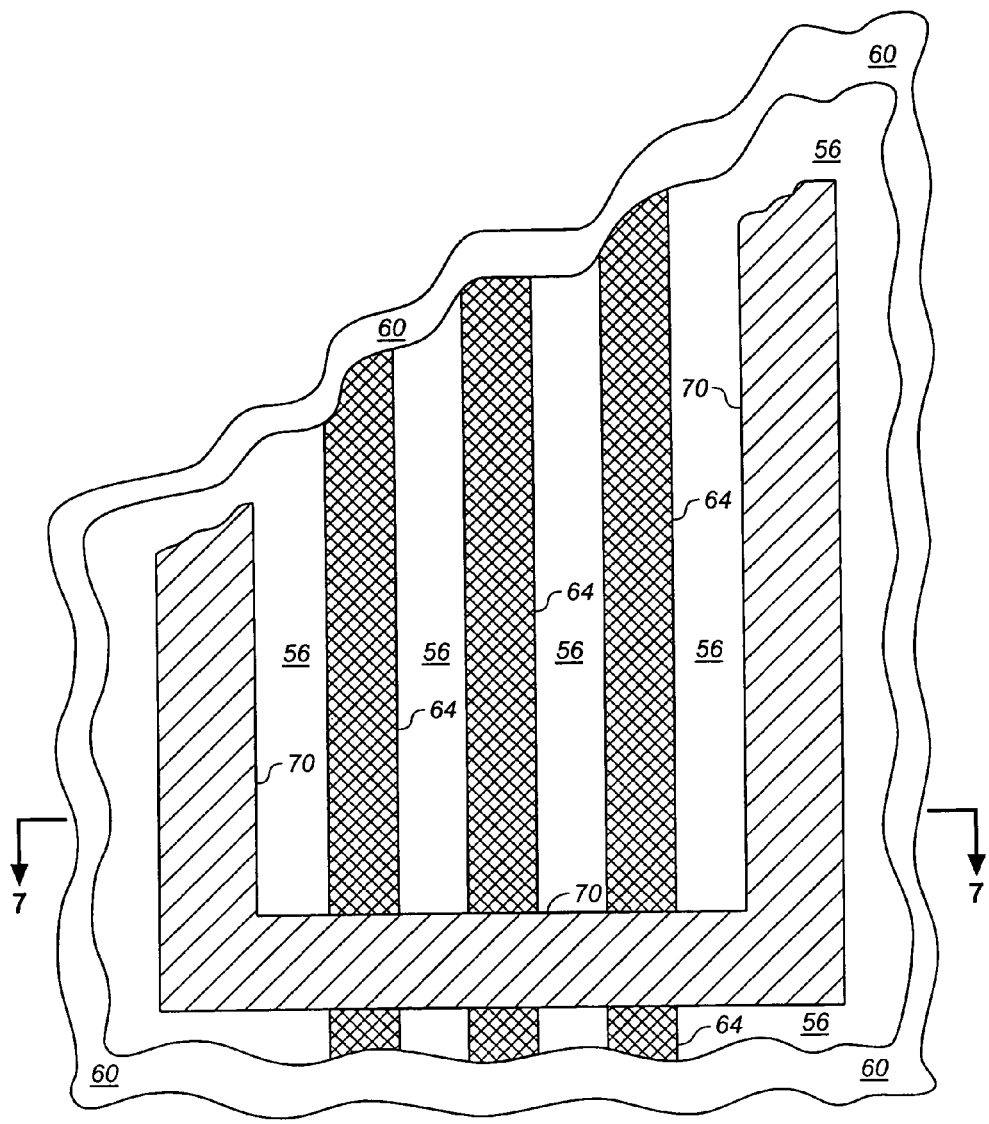
FIG._6

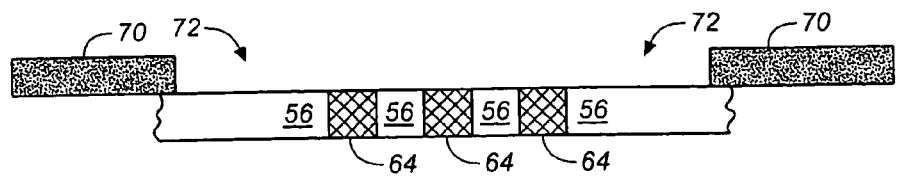
FIG._7
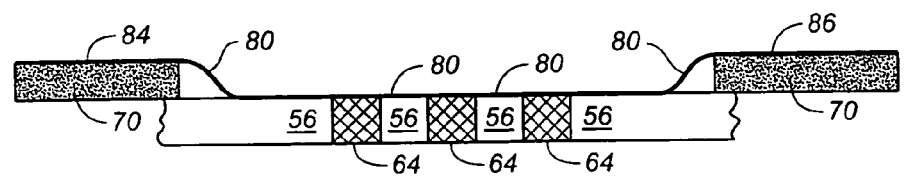
FIG._8
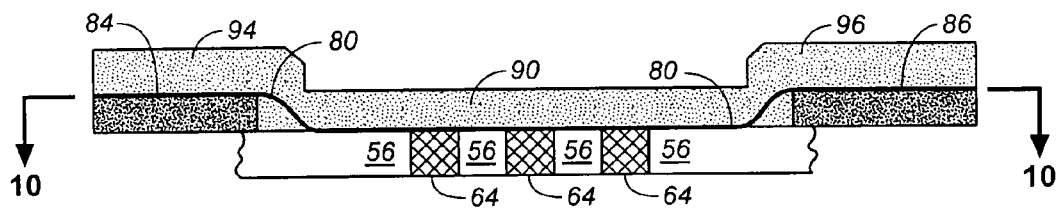
FIG._9
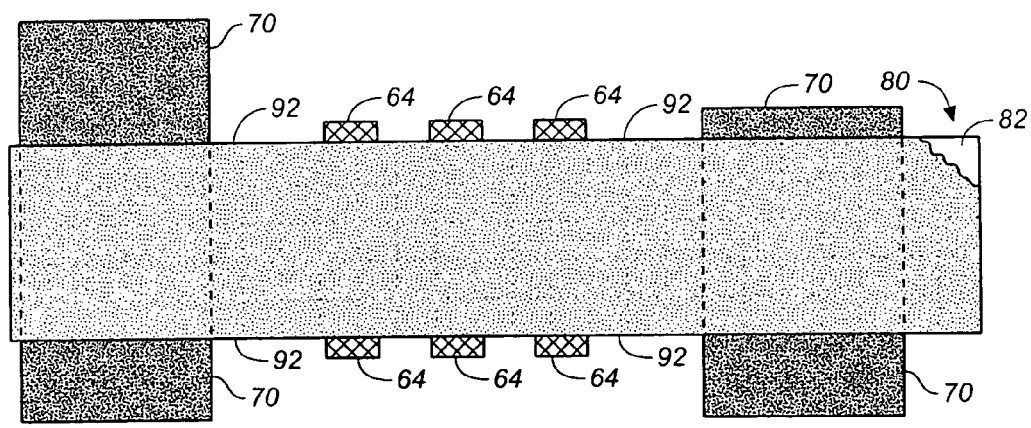
FIG._10

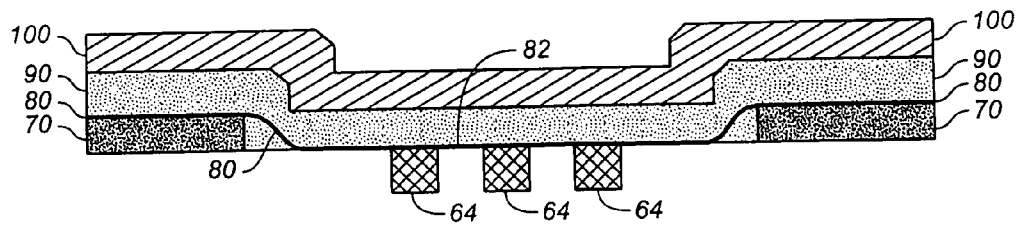
FIG._11
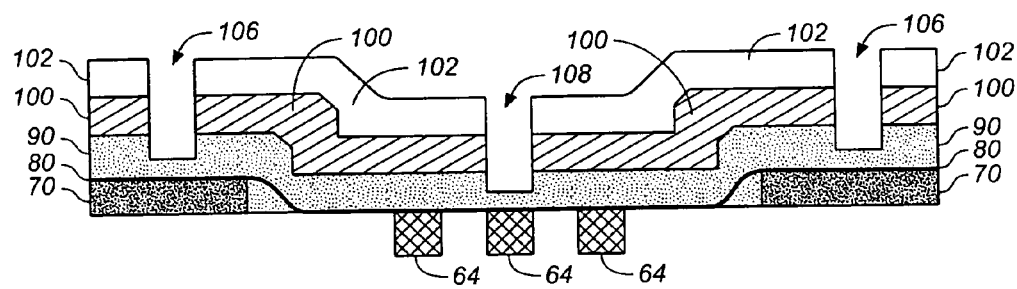
FIG._12
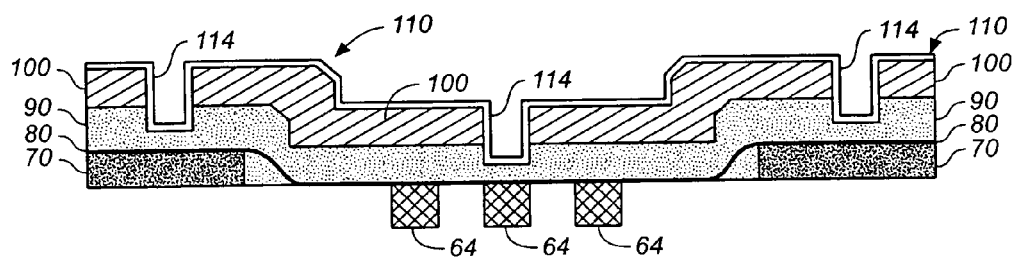
FIG._13
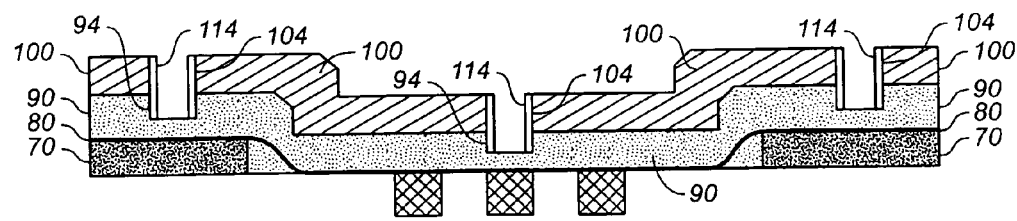
FIG._14

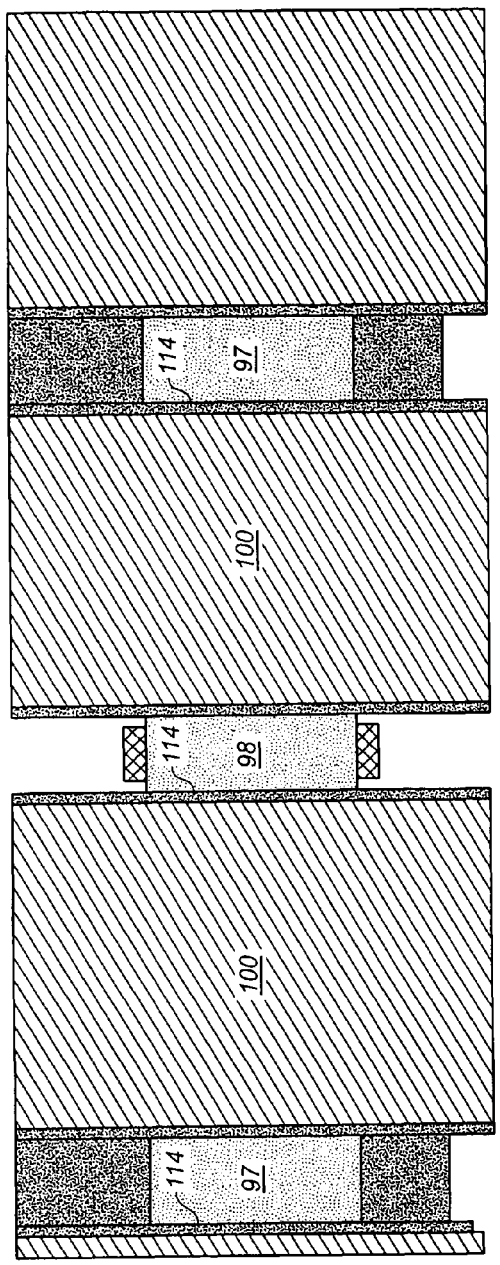
FIG._15
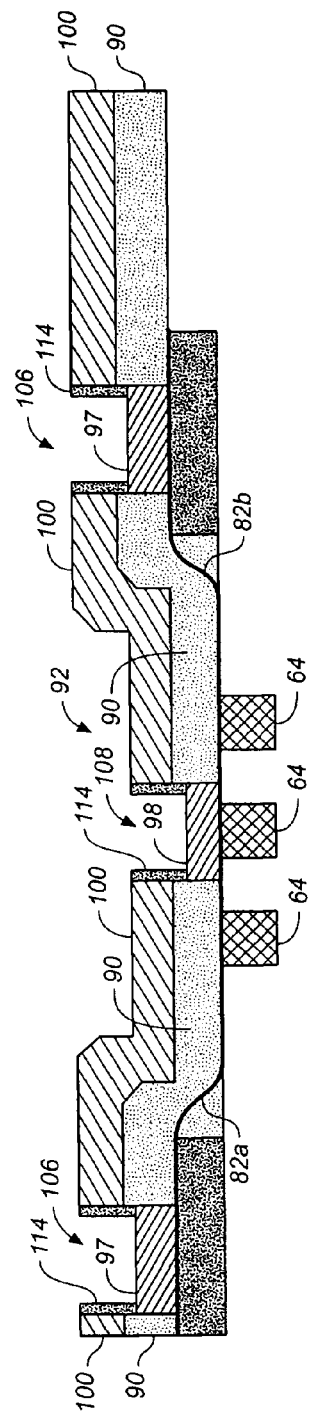
FIG._16

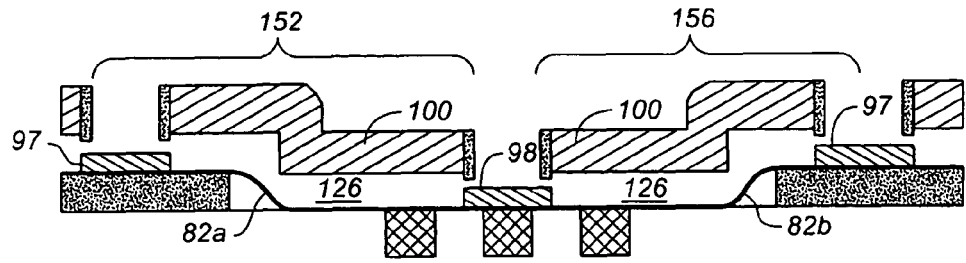
FIG._17
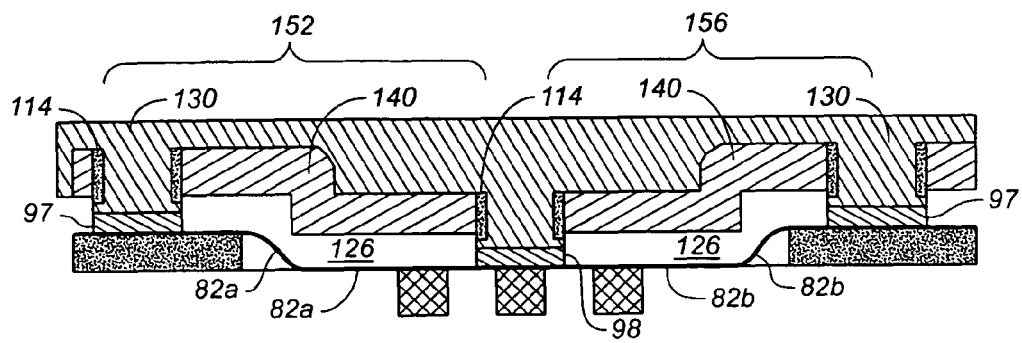
FIG._18
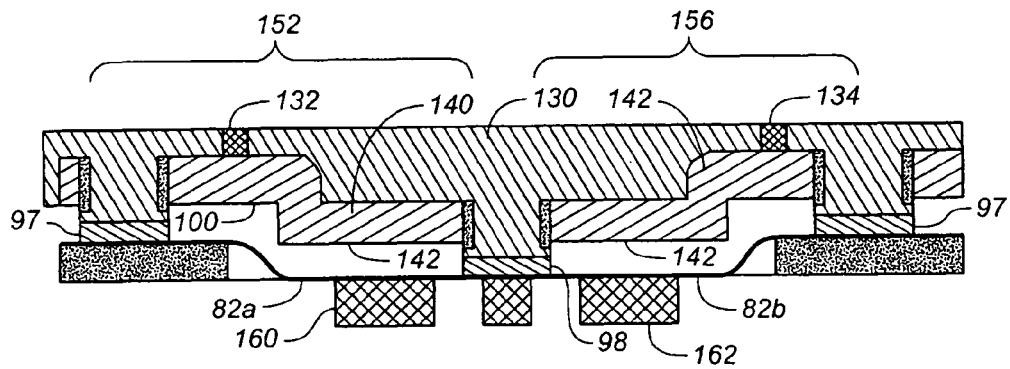
FIG._19
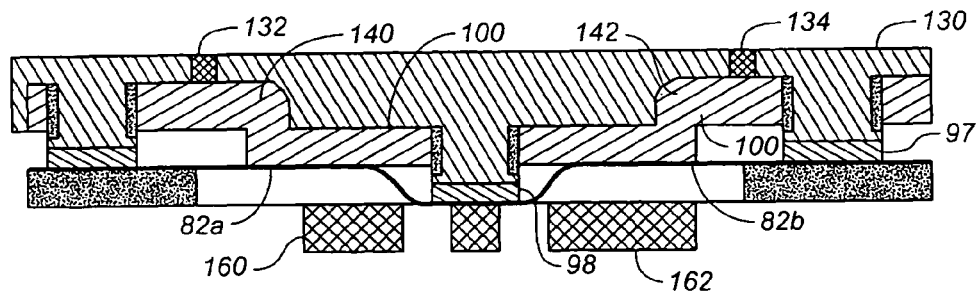
FIG._20

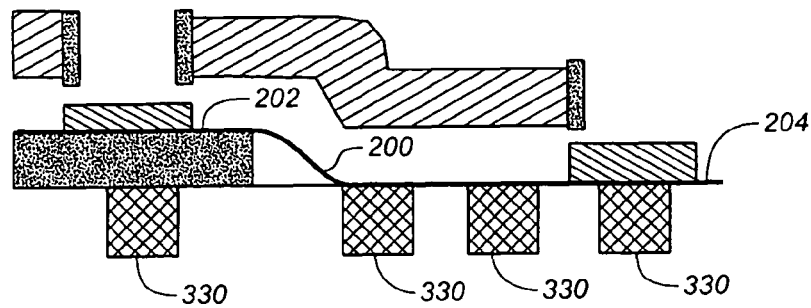
FIG._21
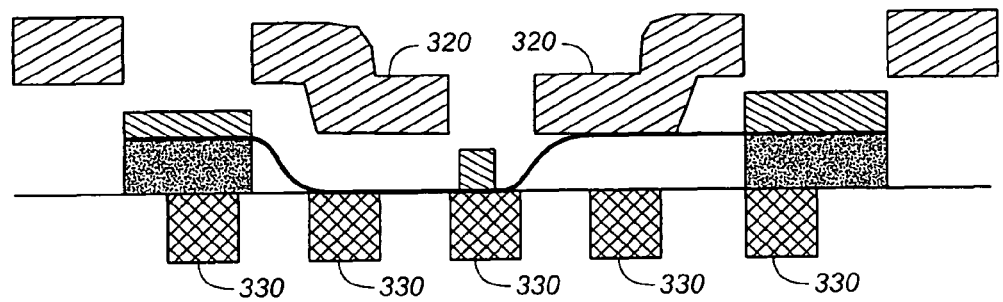
FIG._22
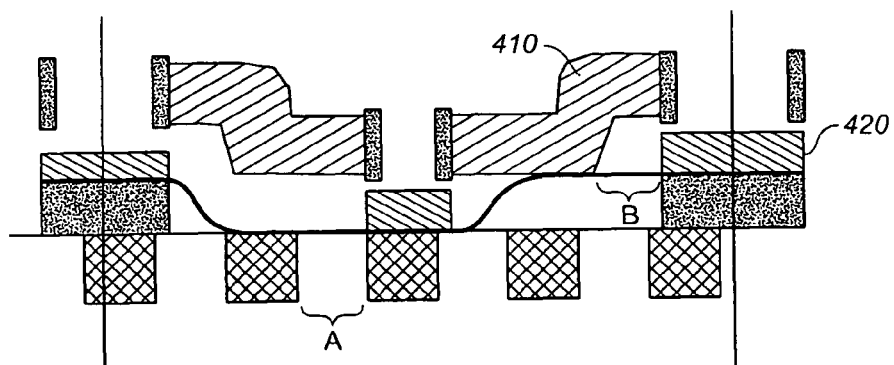
FIG._23

NON-TENSIONED CARBON NANOTUBE SWITCH DESIGN AND PROCESS FOR MAKING SAME

BACKGROUND OF THE INVENTION

1. Field of the Invention

This invention relates to an improved nanotube switch design wherein the nanotube structure is not required to stretch in only one dimension when alternating between off and on positions.

2. Description of the Related Art

Integrated circuit switches such as utilized in the formation of memory cells are constructed in a number of ways giving rise to a number of different switches or memory cells used for formation of many different types of memory, including read only memory (ROM), programmable read only memory (PROM), electrically programmable read only memory (EPROM), dynamic random access memory (DRAM), and static random access memory (SRAM). Important characteristics of these and other memory cells include low cost, programmability (ability to write to), erasability, nonvolatility, high density, low power, and high speed.

Furthermore, the electrical characteristics of the materials used in constructing such switches, such as electromigration of the materials and low resistance, are important as well. Electromigration in metal interconnects and metal-filled vias is one of the key causes of failures in integrated circuit structures.

Actual metallic interconnects that exhibit low resistivity (i.e., a bulk resistivity ~$10^{-6}$ Ω-cm at room temperature, such as copper) also contain a large number of crystallographic and morphological defects, such as impurities, dislocations, vacancies, rough surface morphology, and grain boundaries, as well as a thickness usually close to the mean free path of electrons. Excessive electron-ion scatterings also normally occur at these defects so that higher resistivity, higher rate of Joule heating, and more ion transport results. Failures are hence usually initiated at the site of these defects. On the other hand, the physical layout of the interconnects can also generate a distributed density of electron currents inside the conductors and creates preferential failure sites (i.e., corners of via-wire contacts). Due to all these mechanisms, it is virtually impossible to sustain a current density of ~$10^6$ A/cm$^2$ for a long period of time, even when using state-of-the-art copper interconnects.

More recently, carbon nanotube structures have become of interest due to their superior attributes, including low resistivity, high thermal conductivity, and high melting temperature, when, for example, the carbon nanotube material is compared to copper. In Segal et al. U.S. Pat. No. 6,643,165, issued Nov. 4, 2003, it has been proposed to form a carbon nanotube memory cell for an integrated circuit structure using a ribbon or mat of such carbon nanotubes. The description of such a carbon nanotube memory structure found in the aforesaid Segal et al. patent is hereby incorporated herein by reference.

However, a problem with utilizing the flexibility of the carbon nanotube ribbons in proposed structures to form one or more switches having on/off positions is that the forces exerted on the carbon nanotube ribbon to move it from an "off" position to an "on" position are not identical to the forces needed to return the switch from an "on" position back to an "off" position, as would be desirable in a memory cell to assure nonvolatility of the cell.

As seen in the prior art structure of FIG. 1, where the switch is shown in the "off" position, the unstretched carbon nanotube strip or fiber 10 in the middle of memory chamber 20 lies in the same plane as secured end portions 14 and 16 of the carbon nanotube strip, i.e., in an "at rest" or "off" position. In contrast, the prior art structure of FIG. 2 shows carbon nanotube fiber 10 in an "on" position wherein the middle portion of the carbon nanotube is in a stretched position, i.e., in an "in tension" position. The following equations 1 and 2 below illustrate the amount and type of energy needed to respectively move such carbon nanotube switch structures from an "off" position to an "on" position and from an "on" position back to an "off" position.

$F_{electrostatic} + F_{van\ der\ Waals} > F_{elastic}$ (Switch from "off" to "on")  Equation 1

$F_{electrostatic} + F_{elastic} > F_{van\ der\ Waals}$ (Switch from "on" to "off")  Equation 2

As can be seen in prior art FIG. 1, nanotube strip 10 needs to be elastically stretched and pulled down by the electrostatic force applied to lower electrode 24 to establish a conductive path from lower electrode 24 through the nanotube strip 10 to either first end 14 and/or opposite end 16 of carbon nanotube strip 10 corresponding to the switch's "on" position. To be turned off, the van der Waals forces holding the nanotubes in place must be overcome by pulling the nanotubes toward charged upper electrode 26, such that Equation 2 is satisfied.

It would be desirable to provide a balanced carbon nanotube switching structure which would take approximately the same energy to move the switch from one setting to the other (i.e., from an "off" position to an "on" position, or from an "on" position back to an "off" position); and the same amount of energy to maintain the switch in either the "off" or "on" position once the switch is originally set.

SUMMARY OF THE INVENTION

The invention comprises a carbon nanotube switch suitable for use in an integrated circuit structure and capable of being moved from a first position to a second position using approximately the same energy as required to move the switch from the second position back to the first position. The switch comprises a flexible carbon nanotube strip secured or clamped at one end in a first plane in a switching chamber, and secured or clamped, at the opposite end of the carbon nanotube, in a second plane in the switching chamber, which is parallel to the first plane but spaced therefrom, to permit the central portion of the carbon nanotube strip to move in the chamber between a first position in the first plane and in electrical contact with one or more first electrodes, and a second position in the second plane and in electrical contact with one or more second electrodes.

BRIEF DESCRIPTION OF THE DRAWINGS

FIG. 1 is a fragmentary vertical side section view of a prior art carbon nanotube switch in a non-stretched or "off" position.

FIG. 2 is a fragmentary vertical side section view of the prior art carbon nanotube switch of FIG. 1 in a stretched or "on" position.

FIG. 3A is a fragmentary vertical side section view of a simplified embodiment of a carbon nanotube switch of the invention in a first or "off" position.

FIG. 3B is a fragmentary vertical side section view of the embodiment of the carbon nanotube switch of the invention as shown in FIG. 3A, but in a second or "on" position.

FIG. 4 is a fragmentary vertical side section view of another embodiment of the carbon nanotube switch of the invention showing a first step of the construction of the invention showing formation of damascene metal lines formed in a first dielectric layer over a portion of an integrated circuit structure.

FIG. 5 is a top view of the embodiment of FIG. 4.

FIG. 6 is a top view of FIG. 5 with a second dielectric layer formed over the structure and patterned to form a raised rectangle or wall of the second dielectric material, with a dished or depressed central portion.

FIG. 7 is a fragmentary vertical side section view of the partially formed carbon nanotube switch structure of FIG. 6.

FIG. 8 is a fragmentary vertical side section view of the partially formed carbon nanotube switch structure of FIG. 7 after formation of the carbon nanotube switch layer thereon.

FIG. 9 is a fragmentary vertical side section view of the carbon nanotube switch structure of FIG. 8 after formation of an undoped conformal polysilicon layer thereon.

FIG. 10 is a top view of the carbon nanotube switch structure of FIG. 9.

FIG. 11 is a fragmentary vertical side section view of the carbon nanotube switch structure of FIGS. 9 and 10 after formation of a blanket electrode layer over the structure.

FIG. 12 is a fragmentary vertical side section view of the carbon nanotube switch structure of FIG. 11 with the blanket electrode layer masked and etched to form openings therein extending downwardly through the electrode layer and into the polysilicon layer.

FIG. 13 is a fragmentary vertical side section view of the carbon nanotube switch structure of FIG. 12 after removal of the mask and deposition of a conformal layer of material capable of forming sidewall masks for the sidewalls of the openings previously etched through the electrode layer and into the undoped polysilicon layer.

FIG. 14 is a fragmentary vertical side section view of the carbon nanotube switch structure after an anisotropic etch to remove all of the conformal material except for the desired vertical sidewall masks.

FIG. 15 is a top view of the structure of FIG. 14.

FIG. 16 is a fragmentary vertical side section view of the carbon nanotube switch structure of FIGS. 14 and 15 after boron doping of exposed portions of the previously undoped polysilicon layer.

FIG. 17 is a fragmentary vertical side section view of the carbon nanotube switch structure of FIG. 16 after removal of the undoped polysilicon.

FIG. 18 is a fragmentary vertical side section view of the carbon nanotube switch structure of FIG. 17 after formation of a passivation layer over the carbon nanotube switch structure.

FIG. 19 is a fragmentary vertical side section view of the carbon nanotube switch structure of FIG. 18, after formation of vias through the passivation layer to the upper electrodes, with both of the switches in the "down" position.

FIG. 20 is a fragmentary vertical side section view of the carbon nanotube switch structure of FIG. 19 with both of the switches in the "up" position.

FIG. 21 is a fragmentary vertical side section view of a single carbon nanotube switch structure otherwise similar to the double switch structure shown in FIG. 17, except that the carbon nanotube switch structure of FIG. 21 shows an electrical connection to each of the lower clamps.

FIG. 22 is a fragmentary vertical side section view of a carbon nanotube dual switch structure similar to the switch structure shown in FIG. 17, but showing one of the switches in the "down" position, and the other switch in the "up" position, with both of the tie down structures electrically connected to metal lines.

FIG. 23 is a fragmentary vertical side section view of the carbon nanotube switch structure of FIG. 22 showing critical switching dimensions.

DETAILED DESCRIPTION

Referring now to FIGS. 3A and 3B, the carbon nanotube switch of the invention is illustrated in its simplest form. Carbon nanotube strip 40 is secured or clamped, at a first end 42, to a securement point or electrode 36 which clamps end 42 of carbon nanotube strip 40 to upper planar surface 32 of switch chamber 30. The opposite end 44 of carbon nanotube strip 40 is clamped to opposing planar lower surface 34 of switch chamber 30 by securement point or electrode 38. Upper planar surface 32 is spaced from, but parallel to, lower planar surface 34 of switch chamber 30. Center portion 46 of carbon nanotube 40 is not clamped to switch chamber 30, but is free to move from a "down" position shown in FIG. 3A, to an "up" position illustrated in FIG. 3B, wherein central portion 46 of carbon nanotube strip 40 is in the same plane as upper surface 32 of the switch.

It will be noted that the carbon nanotube strip in the novel switch of the invention does not have a stretched position and a relaxed position, as in the prior art. Rather the force or forces on carbon nanotube strip 40 in either position are approximately equal. The switch of the invention can, therefore, be set in either an "upper" or "on" position, and it will then stay in that position until it is reset into the opposite or "down" position.

To set or reset the switch, an attracting charge is put on upper electrode 50 and a repelling charge may be optionally put on lower electrode 52, resulting in flexible central portion 46 of carbon nanotube 40 moving upwardly from the position shown in FIG. 3A to the position shown in FIG. 3B. To reestablish the switch position shown in FIG. 3A, a repelling electrical charge or force may be optionally applied to upper electrode 50 and an attracting charge will be applied to lower electrode 52.

Electrical connection may thus be made by the carbon nanotube strip between two or more electrodes (not shown) formed on upper surface 32 of switching chamber 30 when switch 30 is in the position shown in FIG. 3B. Conversely, electrical connection may be made, by the carbon nanotube strip, between two or more electrodes (not shown) formed on the bottom surface 34 of switch chamber 30. Alternatively, a conductive path may be established between one of the electrodes on either surface 32 or surface 34 to or from an electrode connected to one end of the carbon nanotube strip itself. It will also become apparent from the construction of the switch or switches to be described below that multicontact switches may also be formed in accordance with the invention.

The simultaneous construction of a pair of single pole, double throw (SPDT) switches will now be described below; it being understood that this is only by way of example and not of limitation. The process to be described may be modified to form a single pole single throw (SPST) switch or more complex switches, such as a double pole double throw (DPDT) switch or multipole switches as well.

a) The Base Beneath the Switch

Turning now to FIGS. 4 and 5, a typical integrated circuit structure 60 is shown with a dielectric layer 56 formed thereover. Metal lines 64 are shown formed on/in layer 56 to provide an electrical connection to some of the electrodes of the switch. Metal lines 64 may be formed by masking and patterning a metal layer, or by using the well known damascene process, when metal lines, such as tungsten or copper metal lines, are to be formed beneath the switch which are not easily masked and etched. It should be noted that additional layers may also be used where necessary, such as, for example, one or more addition insulating layers formed between integrated circuit structure 60 and the bottom of metal lines 64; or one or more additional layers of titanium or titanium nitride when tungsten metal lines are used. It should be noted that the use of such metal lines below the carbon nanotube switch structure is not a required part of the invention. Rather metal lines 64 and dielectric layer 56, together with the recited integrated circuit structure 60, may merely serve as a typical support structure upon which the switch of the invention may be constructed.

b) The Walls Around the Lower Portion of the Switch

FIGS. 6 and 7 illustrate the formation of a raised rectangular wall or spacer 70 surrounding a central dished portion 72 formed by deposition and patterning of a layer of material which, in the illustrated embodiment, comprises an insulating material such as, for example, $Si_3N_4$ or SiC. As best seen in FIG. 6, this wall 70, in the preferred embodiment, forms a box around what will be the carbon nanotube switch area. Wall 70 preferably ranges in height from about 10 nanometers (nm) to about 60 nm.

This box layout is intended to inhibit stray carbon nanotubes from shorting the electrodes. In this design the desired carbon nanotube orientation is across the electrodes 64 at angles ranging between about 45 degrees to about 90 degrees. In the design of this cell, channels in the direction of the desired carbon nanotube direction may have to be formed by conventional means to "guide" the carbon nanotube into the correct orientation when the carbon nanotubes are spun on or deposited by any number of other methods.

In other embodiments, a conductor may be substituted for the raised dielectric wall 70. In such an embodiment, an electrical contact to the outside chip circuitry can be made and tied into all the electrically contacted carbon nanotubes, depending upon the design of the memory. In such a design, the wall or box around the sides of the switch may need to be a dielectric material, while the end portion of the switch, which serves as the lower surface which clamps the ends of the carbon nanotube fibers or strips, is a conductor.

c) Formation of the Flexible Carbon Nanotube Layer

Moving on to FIG. 8, formation of the flexible carbon nanotube layer 80 is shown. Thin flexible carbon nanotube layer 80, which may range in thickness from about 2 nm to about 50 nm, may be deposited by spin coating a suspended solution of carbon nanotubes. Other methods of forming such a carbon nanotube memory structure may be found in the aforesaid Segal et al. U.S. Pat. No. 6,643,165, issued Nov. 4, 2003, the subject matter of which is hereby incorporated herein by reference.

d) Construction of the Upper Clamp and the Switch Chamber

As shown in FIGS. 9 and 10, a conformal layer of undoped polysilicon 90 is then blanket deposited over the structure to a thickness ranging from about 10 nm to about 60 nm, i.e., a thickness approximately equal to the height of wall 70. Undoped polysilicon layer 90 (and underlying carbon nanotube layer 80) are then patterned to form the polysilicon strip 92, shown in FIG. 10, over carbon nanotube strip 82 (which is best seen in the cutaway portion in FIG. 10).

It should be noted that the choice of undoped polysilicon for layer 90 is based on the dopability of undoped polysilicon and the difference in response to wet etching respectively by doped and undoped which permits the undoped polysilicon to be selectively removed during a subsequent wet etch step to form the switch chamber. Other materials having the same characteristics may be substituted for undoped polysilicon.

The two respective end portions 94 and 96 of polysilicon strip 92 (and underlying carbon nanotube strip 82) passing over the raised walls of dielectric box or spacer 70 serve as clamps for the two ends (84 and 86) of the patterned carbon nanotube strip 82 between box 70 and polysilicon strip 92. (As will be discussed below, two switches are being constructed in this description, and the respective end portions 84 and 86 of carbon nanotube strip 82 each represent one end of one of the two switches.)

A conformal layer of conductive material 100 is then formed over the structure, as shown in FIG. 11. As shown in FIG. 12, layer 100 of conductive material is then masked by mask 102 to permit etching of trenches 106 completely through conductive layer 100 to thereby form top electrodes 100. Etching of trenches 106 continues, resulting in partial etching of undoped polysilicon layer 90 to form first trenches 106 in the portion of conductive layer 100, and undoped polysilicon layer 90 above raised dielectric material or spacer 70. Mask 102 is also used to etch a second trench 108 which is also etched completely through electrode layer 100 and partially through undoped polysilicon layer 90.

It will be noted that trench 108 is located above middle electrode 64, i.e., in the dished out portion 72 of dielectric layer 70, and that there is no dielectric material or spacer 70 beneath undoped polysilicon 90 at this point. As will be further explained below, the resulting difference in depth of trenches 106 and 108 permit the opposite ends, respectively, of carbon nanotube strip 82a and 82b to be clamped in two parallel planes at different depths in switch chamber 126.

e) Formation of Sidewall Protection for Openings on Conductive Layer and Polysilicon Layer A conformal layer (of sidewall protection) 110 is then blanket deposited over conductive layer 100, as shown in FIG. 13. Sidewall protection layer 110 is then subject to an anisotropic etch to remove all of the horizontally disposed portions of sidewall protection layer 110, leaving only sidewall protection shoulders 114 to protect the exposed sidewalls 94 of undoped polysilicon layer 90; and to protect the exposed upper sidewalls layer 104 of conductive layer 100, as shown in FIGS. 14 and 15. Such sidewall protection may comprise, for example, silicon oxide ($SiO_2$), silicon nitride ($Si_3N_4$) or any other material capable of protecting sidewalls of conductive layer 100 and undoped polysilicon layer 90 during subsequent doping and etching steps.

f) Implantation of Exposed Polysilicon Layer to Alter Response of Doped Layer to Etchant The exposed upwardly facing polysilicon structure is then subject to a treatment such as, for example, a boron implant, which will render the treated polysilicon selective to subsequent removal by a suitable etchant For example, a boron implant which enters exposed portions 97 and 98 of polysilicon layer 90 in an amount sufficient to modify and convert such exposed polysilicon to provide, for example, a boron-doped polysilicon materials 97 and 98, as seen in FIG. 16, having a different response to subsequent wet etching than undoped polysilicon 90. This different response to wet etching will facilitate subsequent removal of undoped polysilicon 90 to form the desired switch chamber. A boron implantation may be carried out for a sufficient time period and at a sufficient dopant concentration to provide, for example, a boron dopant level of about $1E15$ $cm^2$ using $BF_2$ @ 10 keV in the exposed regions of the previously undoped polysilicon.

Furthermore, the doped material remaining after such a selective etching may comprise a conductive material, and will, in any event, improve the resistance of polysilicon layer 90. Finally, the doped material must be capable of functioning to clamp the flexible carbon nanotube strips at each end.

Other materials could be used instead of undoped polysilicon, and other dopants could be used as well. However, any materials used instead of undoped polysilicon, and any dopant used other than boron, must be capable of converting the undoped material into a material having a different solubility than the undoped material so that the undoped polysilicon equivalent may be selectively etched away to permit formation of the carbon nanotube switch cavity.

g) Removal of Undoped Polysilicon to Form Carbon Nanotube Switch Chamber

Undoped polysilicon 90 may then be removed without any substantial removal of doped polysilicon material 92, e.g., the polysilicon previously doped with boron, using, for example, a KO/isopropyl alcohol wet etchant system selective to boron-doped polysilicon 90. By use of the expression ". . . a wet etchant system which is selective to doped polysilicon . . . " is meant the use of an etchant which favors the etching of undoped polysilicon. Examples of other such wet etchant systems, in addition to the above described KO/isopropyl alcohol wet etchant system, include a combination of KOH and any other suitable alcohol; or a mixture of ethylenediamine pyrocatechol and water (EPW). The result is shown in FIG. 17, wherein switch chamber 126 is shown, formed by the removal of the undoped portions of polysilicon layer 90.

It should also be noted that a further function of doped portions 96 and 98 of polysilicon layer 90 is to provide upper clamps for the carbon nanotube strip 82 remaining after removal of the undoped polysilicon, as shown in FIG. 17. In the structure of FIG. 17, two switches 152 and 156 are shown.

Once the carbon nanotube strip 82 has been clamped by doped portions 97 and 98 of polysilicon layer 90, as shown in FIG. 16 (prior to removal of the undoped polysilicon) and in FIG. 17 (after removal of the undoped polysilicon), carbon nanotube strip 82, in essence, becomes two flexible carbon nanotube strips 82a and 82b (one for switch 152 and one for switch 156).

h) Passivation Layer over Carbon Nanotube Switch Structure

FIG. 18 shows a passivation layer 130 which is then formed over the entire structure to encapsulate the carbon nanotube switches. After formation of passivation or encapsulation 130 layer, vias 132 and 134 are respectively formed vertically through passivation or encapsulation layer 130 to respectively provide electrical contact to respective upper electrodes 140 and 142 on switches 152 and 156, as shown in FIG. 19. Passivation layer 130 may comprise any dielectric material, including, by way of example, and not of limitation: silicon oxide, silicon nitride, silicon oxynitride, or silicon carbide.

i) Operation of Carbon Nanotube Switch

In FIG. 19 both lower electrode 160 and lower electrode 162 have positive (attracting) charges applied to them to cause both of the carbon nanotube strips 82a and 82b to move to the "down" position, as shown in FIG. 19. The carbon nanotube strips will then stay in this position (by van der Waals forces) until attracting charges are applied to upper electrodes 140 and 142 (and optionally repelling charges are applied to lower electrodes 160 and 162), thereby causing carbon nanotube strips 82a and 82b to each return to their "up" position.

FIG. 20 shows both upper electrode 140 and upper electrode 142 having a positive charge applied to each of them to cause both of the carbon nanotube fiber strips 82a and 82b to move to the "up" position where they will remain until a positive or attraction charge is applied to lower electrodes 160 and 162, at which time lower electrodes 160 and 162 will respectively cause carbon nanotube strips 82a and 82b to move to a "down" position.

j) Variations in Design and/or Operation of the Switch

FIG. 21 shows a single switch construction which utilizes a single carbon nanotube switch constructed with the opposing ends 202 and 204 of carbon nanotube strip 200 secured or clamped in parallel but spaced apart planes. When a positive charge is applied to upper electrode 320, the carbon nanotube strip is attracted to an "up" position. When the positive charge is then placed on lower electrode 330, the carbon nanotube strip is attracted back to a "low" position.

FIG. 22 shows a variation of a double switch embodiment wherein lower electrode 330 and upper electrode 320 both have a positive charge applied to them, so that the carbon nanotube strip on the left switch is attracted downwardly (that switch is in the "down" position) and the carbon nanotube strip connected to the right switch is in the "up" position based on the electric charge.

k) Critical Dimensions During Manufacture of Switch

FIG. 23 shows a variation showing the critical switching dimensions which may be tolerated during manufacturing of the switches. The gap, identified in FIG. 23 at "A" as a critical switching dimension, comprises minimum spacing of Damacene lines which is dependent upon the available lithography. The illustrated gap B between electrode 410 and electrode 420 represents the minimum passageway dimension which will still permit the undoped polysilicon to be removed in the wet etch step.

It will be appreciated that other minor variations of the invention also may be made which should be deemed to be within the scope of the claimed invention.

Having thus described the invention what is claimed is:

1. A carbon nanotube switch suitable for use in an integrated circuit structure and capable of being moved from a first position in a first plane to a second position in a second plane approximately parallel to, but spaced from, said first plane of said carbon nanotube switch of the invention, said switch further characterized by use of approximately the same energy to move said switch from said first position in said first plane to said second position in said second plane as required to move said switch back from said second position in said second plane to said first position in said first plane, said switch comprising:
 a) a switching chamber;
 b) a flexible carbon nanotube strip in said switching chamber:
  (i) said flexible carbon nanotube strip secured at one end at a first securement point in said first plane in said switching chamber; and
  (ii) said flexible carbon nanotube strip secured at its opposite end at a second securement point in said second plane in said switching chamber approximately parallel to, and spaced a distance from, said first plane in said switching chamber;
 c) a first electrode located in said first plane; and
 d) a second electrode located in said second plane;
 wherein a central portion of said flexible carbon nanotube strip moves in said switching chamber between said first plane in said switching chamber and said second plane, wherein said first securement point and said first electrode are located in said first plane and said second securement point and said second electrode are located in said second plane, and wherein said second plane is different from, approximately parallel to, and spaced a distance from said first plane.

2. The flexible carbon nanotube switch of claim 1 wherein said flexible carbon nanotube strip contacts at least two electrodes when in either said first or second positions.

3. The flexible carbon nanotube switch of claim 1 wherein said flexible carbon nanotube strip contacts at least three or more electrodes when in either said first or said second positions.

4. A flexible carbon nanotube switch suitable for use in an integrated circuit structure and having a flexible carbon nanotube strip capable of being moved from a first position in a first plane to a second position in a second plane approximately parallel to, but spaced from, said first plane, using approximately the same energy as required to move the switch from said second position back to said first position, which comprises:
   a) a switching chamber;
   b) a flexible carbon nanotube strip in said switching chamber;
      1) having one end secured at a first securement point in a first plane in said switching chamber;
      2) having an opposite end secured at a second securement point in a second plane in said switching chamber approximately parallel to, and spaced a distance from said first plane in said switching chamber; and
      3) a central portion of said flexible carbon nanotube strip capable of moving in said switching chamber between said first position in said first plane in said switching chamber, and a second position approximately parallel to said second plane and in electrical contact with one or more second electrodes;
   c) a plurality of first electrodes in electrical contact with said flexible carbon nanotube strip when said flexible carbon nanotube strip is in said first position in said first plane; and
   d) a plurality of second electrodes in electrical contact with said flexible carbon nanotube strip when said flexible carbon nanotube strip is in said second position in said second plane
   wherein said first securement point and said plurality of first electrodes are located in said first plane and said second securement point and said plurality of second electrodes are located in said second plane, and wherein said second plane is different from, approximately parallel to, and spaced a distance from said first plane.

* * * * *